United States Patent
Rogers et al.

(10) Patent No.: US 9,897,666 B2
(45) Date of Patent: Feb. 20, 2018

(54) CHIP-SCALE OPTOMECHANICAL MAGNETOMETER

(71) Applicant: The Johns Hopkins University, Baltimore, MD (US)

(72) Inventors: Daniel J. Rogers, Baltimore, MD (US); Stergios J. Papadakis, Ellicott City, MD (US); Layne R. Churchill, Ellicott City, MD (US); Chee Wei Wong, Singapore (SG)

(73) Assignee: The Johns Hopkins University, Baltimore, MD (US)

( * ) Notice: Subject to any disclaimer, the term of this patent is extended or adjusted under 35 U.S.C. 154(b) by 466 days.

(21) Appl. No.: 14/569,893

(22) Filed: Dec. 15, 2014

(65) Prior Publication Data
US 2015/0168504 A1 Jun. 18, 2015

Related U.S. Application Data

(60) Provisional application No. 61/916,319, filed on Dec. 16, 2013.

(51) Int. Cl.
G01R 33/032 (2006.01)

(52) U.S. Cl.
CPC ....... *G01R 33/032* (2013.01); *G01R 33/0327* (2013.01)

(58) Field of Classification Search
CPC .......................... G01R 33/0283; G01R 33/0286
See application file for complete search history.

(56) References Cited

U.S. PATENT DOCUMENTS

| | | | |
|---|---|---|---|
| 5,959,452 A | 9/1999 | Givens et al. | |
| 6,018,386 A * | 1/2000 | Radun | G01H 9/00 356/213 |
| 6,819,103 B2 | 11/2004 | Champion et al. | |
| 7,394,245 B2 | 7/2008 | Brunson et al. | |
| 7,501,815 B2 | 3/2009 | Brunson et al. | |
| 7,696,749 B2 | 4/2010 | Sunier et al. | |
| 8,269,976 B2 | 9/2012 | Kilic et al. | |
| 8,278,919 B2 | 10/2012 | Fischer et al. | |
| 8,402,666 B1 | 3/2013 | Hsu et al. | |
| 8,674,689 B1 | 3/2014 | Nielson et al. | |
| 8,860,409 B2 | 10/2014 | Seeger et al. | |
| 2001/0035750 A1 | 11/2001 | Murphy | |
| 2004/0151217 A1* | 8/2004 | Yeik | A61B 18/20 372/25 |
| 2007/0208239 A1* | 9/2007 | Sato | A61B 5/0059 600/322 |
| 2008/0267557 A1* | 10/2008 | Wang | B82Y 20/00 385/16 |

(Continued)

*Primary Examiner* — Jermele M Hollington
*Assistant Examiner* — Feba Pothen
(74) *Attorney, Agent, or Firm* — Sung T. Kim

(57) ABSTRACT

An optomechanical oscillator for measuring a magnetic field may include a fixed substrate, a moveable mass separated from the fixed substrate by a slot, a photonic crystal comprising an optomechanical cavity formed at the slot, and a current source operably coupled to provide current to the photonic crystal. The moveable mass may be moveable responsive to placement of the optomechanical oscillator in a magnetic field based on interaction of the magnetic field and the current. The magnetic field may be measureable based on displacement of the moveable mass.

18 Claims, 4 Drawing Sheets

(56) References Cited

U.S. PATENT DOCUMENTS

| | | | |
|---|---|---|---|
| 2008/0272852 A1* | 11/2008 | Six | H03H 9/02259 331/154 |
| 2014/0125325 A1 | 5/2014 | Ocak et al. | |
| 2014/0283601 A1 | 9/2014 | Bhave et al. | |

* cited by examiner

CHIP-SCALE OPTOMECHANICAL MAGNETOMETER

CROSS-REFERENCE TO RELATED APPLICATIONS

This application claims the benefit of U.S. Provisional Application No. 61/916,319 filed on Dec. 16, 2013, the entire contents of which are hereby incorporated herein by reference.

TECHNICAL FIELD

Exemplary embodiments of the present disclosure generally relate to magnetometers, and more specifically to exemplary chip-scale high-performance magnetometers having cavity optomechanics.

BACKGROUND

Magnetometers are measurement instruments that can be used to measure the amount of magnetization of magnetic materials, or to measure the strength of a magnetic field. In some cases, magnetometers can also indicate the direction of a magnetic field at a point in space. These basic uses can be translated into more specific uses such as, for example, identifying magnetic anomalies, measuring the earth's magnetic field, detecting metals and/or the like. In recent years, miniaturized magnetometers have also found uses as compasses in mobile phones as the ability to incorporate magnetometers into integrated circuits has emerged.

However, a relatively small, yet still portable and robust magnetometer, such as a compact chip-scale magnetometer, has not yet been developed.

BRIEF SUMMARY OF SOME EXAMPLES

Accordingly, some example embodiments may enable the provision of a chip-scale high-performance magnetometer through cavity optomechanics and methods for using the same. Exemplary embodiments of the present disclosure may provide, for example, a compact and array-scalable optical readout magnetometer that may use the Lorentz force to measure magnetic fields. Some example embodiments may therefore be employed for uses described above or numerous other uses that would benefit from chip-scale, compact designs.

In one example embodiment, an optomechanical oscillator for measuring a magnetic field is provided. The optomechanical oscillator may include a fixed substrate, a moveable mass separated from the fixed substrate by a slot, a photonic crystal comprising an optomechanical cavity formed at the slot, and a current source operably coupled to provide current to the photonic crystal. The moveable mass may be moveable responsive to placement of the optomechanical oscillator in a magnetic field based on interaction of the magnetic field and the current. The magnetic field may be measureable based on displacement of the moveable mass.

In another example embodiment, an apparatus for measuring a magnetic field is provided. The apparatus may include a laser light source, a sensing element exposable to a magnetic field and a current source, and an optical detector. The sensing element may include an optomechanical oscillator including a fixed substrate, a moveable mass separated from the fixed substrate by a slot, a photonic crystal comprising an optomechanical cavity formed at the slot, and the current source which may be operably coupled to provide current to the photonic crystal. The moveable mass may be moveable responsive to placement of the optomechanical oscillator in the magnetic field based on interaction of the magnetic field and the current. The magnetic field may be measureable by the optical detector based on displacement of the moveable mass.

In another example embodiment, a method for measuring a magnetic field is provided. The method may include providing a current to an optomechanical oscillator structured to deform under a magnetic force to cause a shift in resonance associated with an optomechanical cavity formed in the optomechanical oscillator, placing the optomechanical oscillator in a magnetic field capable of providing the magnetic force, measuring light passed through the optomechanical oscillator to determine a change in resonance of the optomechanical cavity, and determining a measurement of the magnetic field based on the change in resonance.

BRIEF DESCRIPTION OF THE SEVERAL VIEWS OF THE DRAWING(S)

Having thus described some embodiments of the invention in general terms, reference will now be made to the accompanying drawings, which are not necessarily drawn to scale, and wherein:

DETAILED DESCRIPTION

Figure 1:
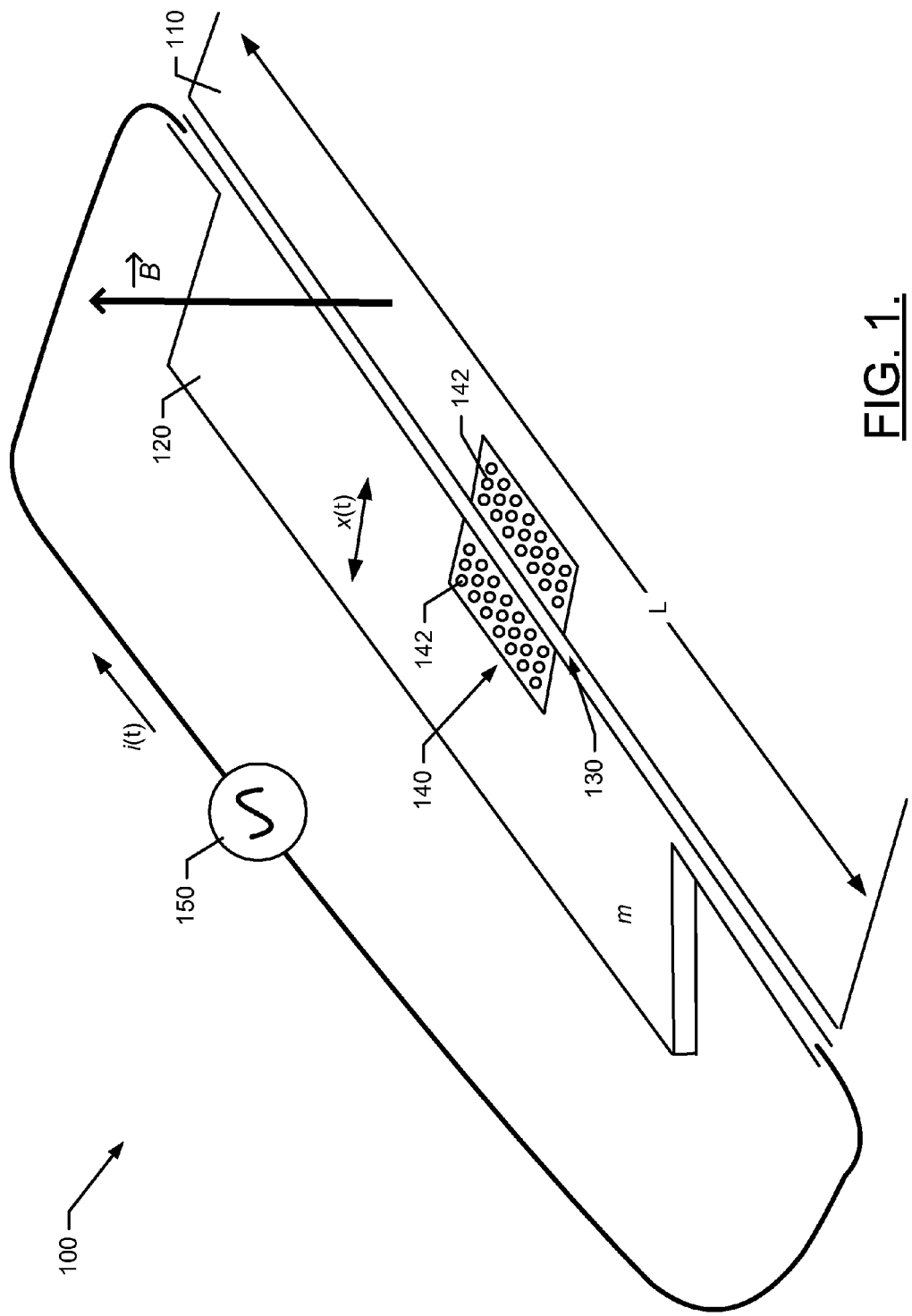
FIG. 1 illustrates an example of a chip-scale optical oscillator assembly for optomechanical magnetometry according to an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

Some example embodiments may enable the provision of a chip-scale magnetometer that may be small and portable, while still providing a relatively high degree of sensitivity. Some embodiments may provide a mass attached to an optomechanical cavity. The impact of a magnetic field on the mass may cause properties of the optomechanical cavity to be altered. In particular, the mass may have a current passed through a conductor attached to or provided as a portion of the mass. The mass may be suspended proximate to a fixed substrate forming an optical cavity or slot between the mass and the fixed substrate. When a current is passed, and while in the presence of a magnetic field, the mass will be displaced (e.g., based on the Lorentz force) by some amount and the cavity dimensions will change. As the cavity dimensions change, the properties of the cavity relative to modulation of a laser passed therethrough may also change. By monitoring changes in the modulation, a determination may be made as to the corresponding strength of the magnetic field that caused the change in modulation.

The provision of an accurate and sensitive magnetometer that is also portable may enable the magnetometer to be advantageously employed in a number of environments outside of the laboratory. For example, some example embodiments may be useful in connection with conducting large-scale surveys regarding changes in magnetic fields. Some embodiments may also be useful in connection with performing earth observations relating to geophysics research. Moreover, example embodiments may be employed in microelectromechanical systems (MEMS) and/or nanoelectromechanical systems (NEMS) that may be used in the provision of highly capable, and yet very small devices (e.g., micromachines and/or nanobots). Many other uses are also possible, and thus the examples above should not be seen as limiting relative to the scope of example embodiments.

FIG. 1 illustrates an example of a chip-scale optical oscillator assembly 100 for optomechanical magnetometry according to an example embodiment. In this regard, FIG. 1 illustrates a concept view of the chip-scale optical oscillator assembly 100, which may be provided as a portion of a sensing element of an example embodiment. The chip-scale optical oscillator assembly 100 may be formed on a substrate 110. The substrate 100 may be a crystal material (e.g., silicon) and may be substantially fixed relative to a moveable mass 120 that may be disposed proximate to the substrate 100. The moveable mass 120 may be suspended a small distance away from the substrate 100 to form a slot 130 therebetween.

As shown in FIG. 1, a photonic crystal 140 having a plurality of holes 142 formed therein may be provided on opposite sides of the slot 130 to form an optomechanical cavity. The holes 142 are generally disposed in a pattern on opposing sides of the slot 130. The holes 142 essentially form mirrors so that the slot 130 may form a waveguide through which laser energy may be provided. The moveable mass 120 may be in electrical communication with a current source 150 to pass a current (e.g., i(t)) through the photonic crystal 140. When the chip-scale optical oscillator assembly 100 is in the presence of a magnetic field ($\vec{B}$), the Lorentz force may cause the moveable mass 100 to be displaced (e.g., by a value x(t)), which alters the width of the slot 130.

As mentioned above, responsive to the application of the current in the presence of the magnetic field, the photonic crystal 140 may experience a displacement. As such, the holes 142 are displaced to create localized cavity resonances, for example, with a differential shift that may be determinable. The displacement of the holes 142 in the design causes a different index of refraction to be encountered in the portion where the displaced holes are provided. This displacement is detectable and can be measured.

The resonance characteristics of the slot 130 are dependent upon the width of the slot 130. As the moveable mass 120 of the optical oscillator assembly 100 is affected by the magnetic field to displace the moveable mass 120, the width of the slot 130 may be altered. The alteration of the width of the slot 130 may then be detected as a change in resonance characteristics of the cavity. For example, the response of the mass to the magnetic field may cause a change in the width of the slot 130, which may be perceived as a flexing of the slot 130. As the slot flexes in response to the impact of the magnetic field on the moveable mass 120, a change in the amplitude and phase of laser energy transmitted through the slot 130 may be detected. The change in amplitude and phase of the laser energy may be indicative of the modulation of the laser energy as caused by a change in the magnetic field.

In the context of the example of FIG. 1, in one example case, the effective mass (m) of the moveable mass 120 may be 2.00 E−15 kg, and the resonant frequency may be 6.00 E+0.04 Hz. The current may be an oscillating current of 1.00 E−0.05 A and the length of the moveable mass 120 (L) may be 2.50 E−0.04 m. Displacement sensitivity may be 1.00 E−15 m/(Hz^½) and magnetic sensitivity may be 1.14 E−10 T/(Hz^½). Nanobeam length may be about 250 μm. In the presence of the static magnetic field oriented substantially perpendicular to the plane of the device, the oscillating current induces an oscillating displacement in one of the nanobeams. By probing the cavity with a properly tuned laser, the oscillating displacement will induce a frequency and phase modulation on the optical signal that can be read out using an RF spectrum analyzer and/or homodyne detector, plus lock-in amplification at the current oscillation frequency, to achieve maximally sensitive magnetic field amplitude detection.

Figure 2:
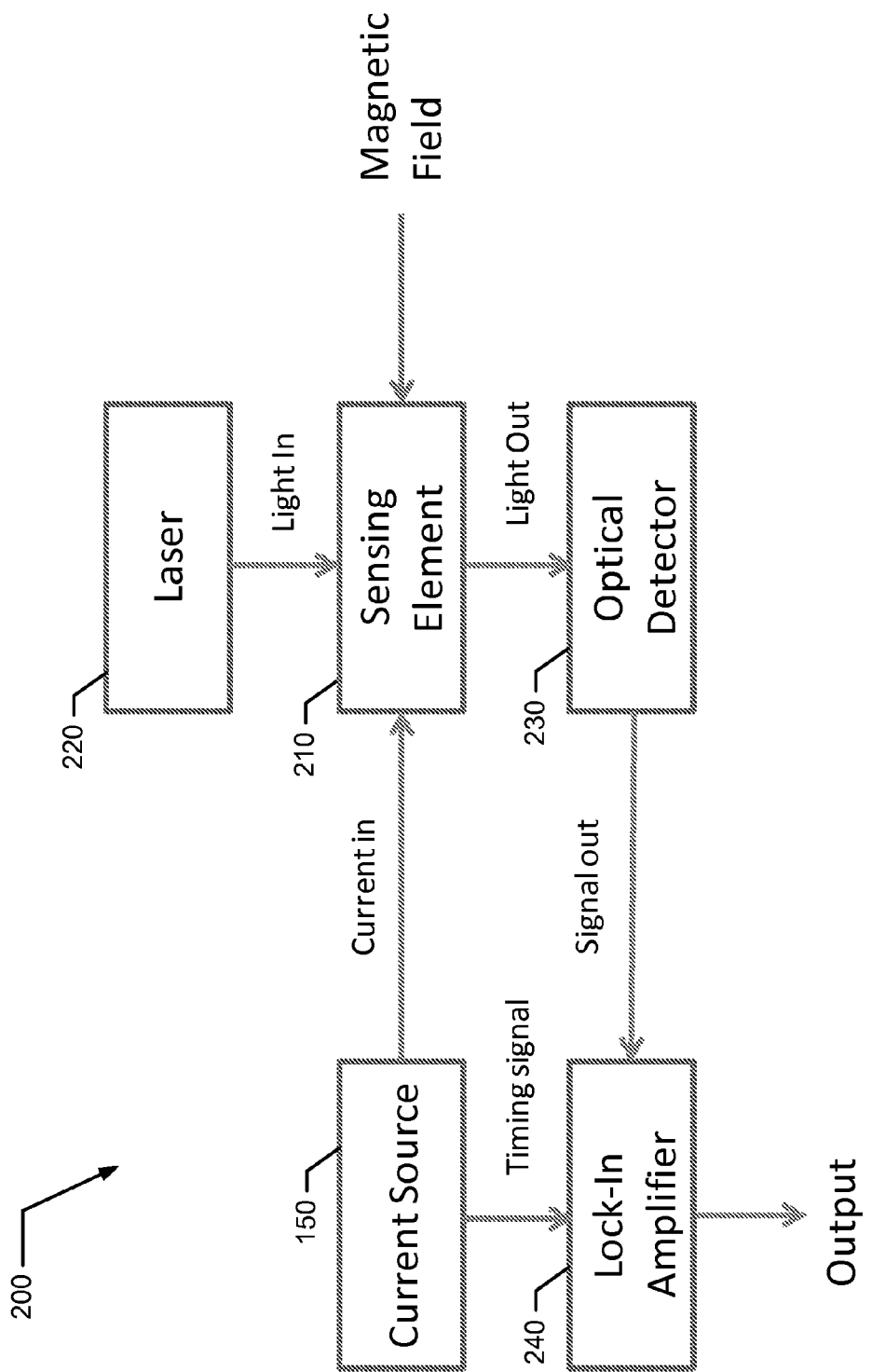
FIG. 2 illustrates a block diagram of a chip-scale optomechanical magnetometer employing the optical oscillator assembly shown in FIG. 1 in accordance with an example embodiment.

FIG. 2 illustrates a block diagram of a chip-scale optomechanical magnetometer 200 employing the optical oscillator assembly 100 of FIG. 1 in accordance with an example embodiment. As shown in FIG. 2, the chip-scale optomechanical magnetometer 200 may include a sensing element 210. The sensing element 210 may include the optical oscillator assembly 100 having the photonic crystal 140 of FIG. 1. The sensing element 210 may be provided with current by the current source 150, as described above.

An illuminator (e.g., laser 220) may direct light toward the sensing element 210. As discussed above, the photonic crystal 140 has holes 142 disposed on opposite sides of the slot 130, and the photonic crystal 140 is attached to a moveable mass 120. As indicated above, as the moveable mass 120, with a current provided thereto, is impacted by the magnetic field, the width of the slot 130 may be altered and thereby also the modulation experienced by laser energy passed through the slot 130 is changed. By monitoring phase and amplitude changes indicative of the modulation changes using an optical detector 230, changes in the magnetic field (or a displacement indicative of the strength of the magnetic field) may be determined. In an example embodiment, a signal out of the optical detector 230 may be provided to a lock-in amplifier 240. The lock-in amplifier 240 may also receive a timing signal from the current source 150 in order to generate an output that is indicative of magnetic field strength or a change in the magnetic field.

Principles associated with the Lorentz force may be employed to determine the force exerted on a wire carrying electrical current within a magnetic field. If a particle of charge q moves with velocity v in the presence of an electric field E and a magnetic field B, then it will experience a force. For any produced force there will be an opposite reactive force. By considering the Lorentz force (F=q(E+v×B)) in the context of the definition of current flow in a conductor, the magnetic field B can be solved for as:

$$B = \frac{F}{iL}.$$

Meanwhile, a nanobeam restoring force may be F=kx and resonant frequency as a function of k and mass may be indicated by $$f = \frac{1}{2\pi}\sqrt{k/m}.$$

Magnetic sensitivity as a function of displacement sensitivity may therefore be show as $$dB = \left(\frac{4\pi^2 mf^2}{iL}\right)dx.$$

Figure 3:
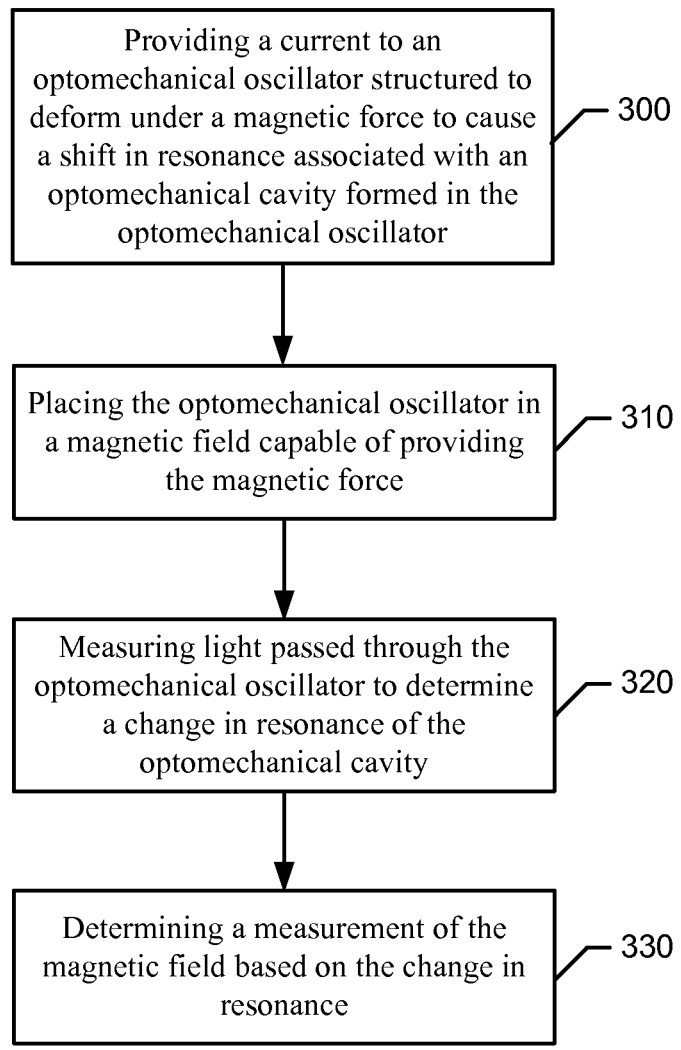
FIG. 3 shows an exemplary block diagram of a method for measuring a magnetic field according to an example embodiment.

FIG. 3 illustrates a block diagram of a method of measuring a magnetic field is provided. The method may include providing a current to an optomechanical oscillator structured to deform under a magnetic force to cause a shift in resonance associated with an optomechanical cavity formed in the optomechanical oscillator at operation 300. The method may further include placing the optomechanical oscillator in a magnetic field capable of providing the magnetic force at operation 310, measuring light passed through the optomechanical oscillator to determine a change in resonance of the optomechanical cavity at operation 320, and determining a measurement of the magnetic field based on the change in resonance at operation 330. In some cases, providing the current to the optomechanical oscillator may include providing the current to a photonic crystal disposed at a slot defined between a fixed substrate and a moveable mass. In an example embodiment, the optomechanical oscillator may include a chip-scale optical oscillator including the photonic crystal, the photonic crystal having holes formed therein on opposite sides of the slot to form a waveguide for an optical signal to travel through the slot.

Exemplary embodiments similar to those presented above in FIGS. 1 and 2 may provide a chip-scale magnetometer that can be based on, for example, the high-Q/V air-slot photonic crystal mode gap cavity examined for cavity optomechanics. This exemplary optomechanical oscillator may have a loaded optical Q in excess of $10^4$ measured ($10^6$ theory) while preserving, for example, a deeply-subwavelength optical modal volume V of $\sim 0.02(\lambda/n)^3$. The magnetic force may serve to displace ($\delta x$) the mechanical oscillator position as described above. Nanobeams can be provided for a mode displacement that is either common or differential (e.g., such that one nanobeam can be much more compliant than the other)—both of which can result in a perturbation to the optical cavity resonance. The resonance shift may depend linearly on the air-slot spacing. The perturbed optical resonance may be detected by measuring the differential transmitted intensity.

Figure 4:
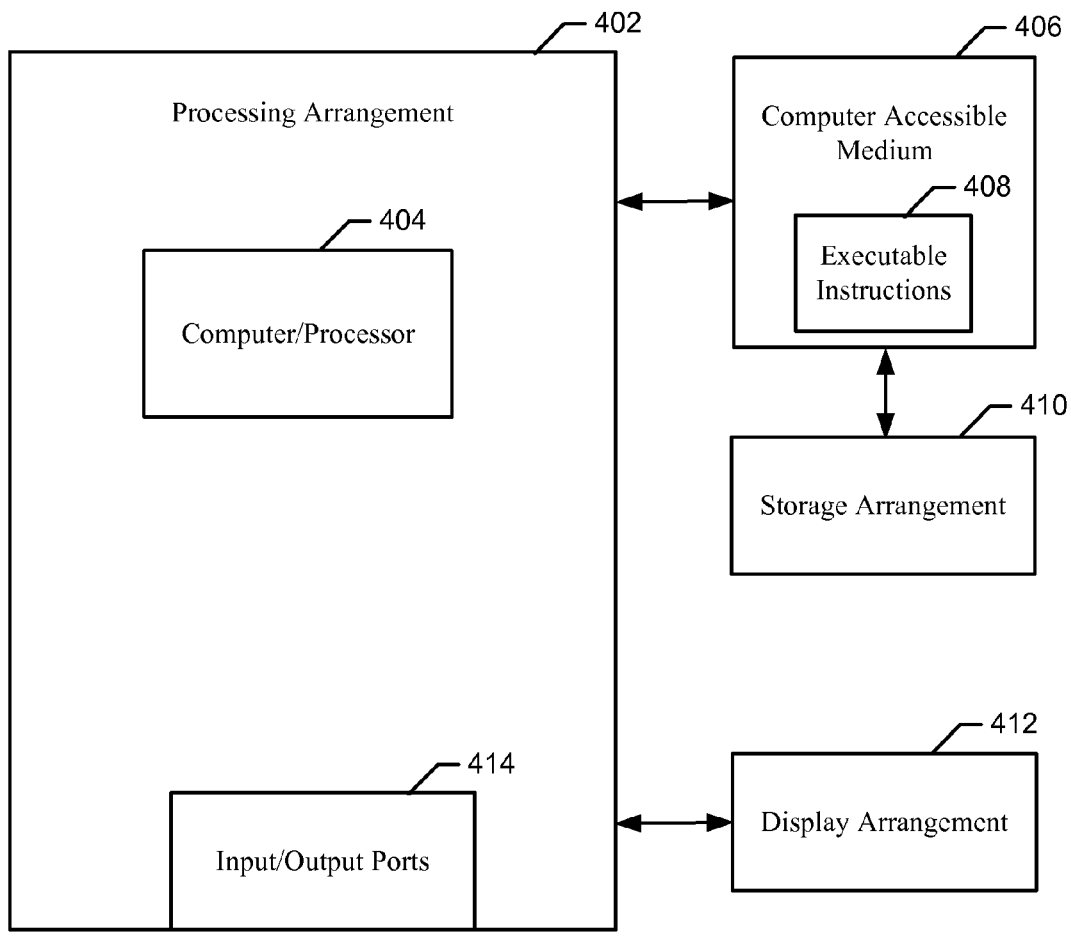
FIG. 4 shows an exemplary block diagram of a system according to an example embodiment.

FIG. 4 shows an exemplary block diagram of an exemplary embodiment of a system according to the present disclosure. For example, exemplary procedures in accordance with the present disclosure described herein can be performed by a processing arrangement and/or a computing arrangement 402. Such processing/computing arrangement 402 can be, e.g., entirely or a part of, or include, but not limited to, a computer/processor 404 that can include, e.g., one or more microprocessors, and use instructions stored on a computer-accessible medium (e.g., RAM, ROM, hard drive, or other storage device). The computing arrangement 402 may be used to calculate values associated with determining magnetic field measurements as described herein.

As shown in FIG. 4, a computer-accessible medium 406 (e.g., as described herein above, a storage device such as a hard disk, floppy disk, memory stick, CD-ROM, RAM, ROM, etc., or a collection thereof) may be provided (e.g., in communication with the processing arrangement 402). The computer-accessible medium 406 may store executable instructions 408 thereon. In addition or alternatively, a storage arrangement 410 can be provided separately from the computer-accessible medium 406, which may provide the instructions to the processing arrangement 402 so as to configure the processing arrangement to execute certain exemplary procedures, processes and methods, as described herein above, for example. The exemplary instructions and/or procedures may be used for determining a shift in a resonance associated with at least one optomechanical oscillator based on, e.g., the exemplary procedure described herein and associated with the exemplary embodiments of FIGS. 1-3.

Further, the exemplary processing arrangement 402 can be provided with or include an input/output arrangement 414, which can include, e.g., a wired network, a wireless network, the internet, an intranet, a data collection probe, a sensor, etc. As shown in FIG. 4, the exemplary processing arrangement 402 can be in communication with an exemplary display arrangement 412, which, according to certain exemplary embodiments of the present disclosure, can be a touch-screen configured for inputting information to the processing arrangement in addition to outputting information from the processing arrangement, for example. Further, the exemplary display 412 and/or a storage arrangement 410 can be used to display and/or store data in a user-accessible format and/or user-readable format.

It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof.

Accordingly, some example embodiments may be provided to employ a relatively small and potentially mobile assembly for conducting magnetometry measurements. In this regard, some example embodiments may provide a chip-scale magnetometer that is capable of measuring relatively small and/or slow changes in magnetic fields with a relatively high degree of sensitivity. Example embodiments may provide a small space for light to pass through with a strong non-linear interaction employed to couple optic and mechanical modes. The non-linear response to the optical field coupled with the small mode volume of example embodiments, which small mode volume may be provided as the volume between a slot and mirror-like holes formed on either side of the slot within a photonic crystal, may provide noise cancellation that provides superior sensitivity for example embodiments.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. An optomechanical oscillator for measuring a magnetic field comprising:
   a fixed substrate;
   a moveable mass separated from the fixed substrate by a slot;
   a photonic crystal comprising an optomechanical cavity formed at the slot, wherein the photonic crystal is provided on the fixed substrate and the moveable mass on opposite sides of the slot to form the optomechanical cavity; and
   a current source operably coupled to provide current to the photonic crystal,
   wherein the moveable mass is moveable responsive to placement of the optomechanical oscillator in a magnetic field based on interaction of the magnetic field and the current, and
   wherein the magnetic field is measureable based on displacement of the moveable mass.

2. The optomechanical oscillator of claim 1, wherein the current source comprises an oscillating source.

3. The optomechanical oscillator of claim 1, wherein the current source comprises a direct current source.

4. The optomechanical oscillator of claim 1, wherein the displacement of the moveable mass is a function of a width of the slot.

5. The optomechanical oscillator of claim 4, wherein a change in width of the slot is indicative of a shift in resonance of the optomechanical cavity.

6. The optomechanical oscillator of claim 1, wherein the optomechanical oscillator comprises a chip-scale optical oscillator, wherein the photonic crystal includes holes formed therein on opposite sides of the slot to form a waveguide for an optical signal to travel through the slot.

7. The optomechanical oscillator of claim 6, wherein a width of the slot is changeable based on the magnetic field such that a change in the width of the slot causes the shift in resonance of the optomechanical cavity, and wherein the shift in resonance is measured to provide an indication of the magnetic field.

8. An apparatus for measuring a magnetic field comprising:
   a laser light source;
   a sensing element exposable to a magnetic field and a current source, and
   an optical detector configured to receive light from the laser light source passed through the sensing element,
   wherein the sensing element comprises an optomechanical oscillator including:
      a fixed substrate;
      a moveable mass separated from the fixed substrate by a slot;
      a photonic crystal comprising an optomechanical cavity formed at the slot, wherein the photonic crystal is provided on the fixed substrate and the moveable mass on opposite sides of the slot to form the optomechanical cavity; and
      the current source operably coupled to provide current to the photonic crystal,
   wherein the moveable mass is moveable responsive to placement of the optomechanical oscillator in the magnetic field based on interaction of the magnetic field and the current, and
   wherein the magnetic field is measureable by the optical detector based on modulation of the light from the laser light source caused at least in part by displacement of the moveable mass.

9. The apparatus of claim 8, wherein the current source comprises a direct current source.

10. The apparatus of claim 8, wherein the current source comprises an oscillating source.

11. The apparatus of claim 10, further comprising a lock-in amplifier timed to the oscillating source and operably coupled to the optical detector to increase sensitivity of magnetic field amplitude detection by the optical detector.

12. The apparatus of claim 8, wherein the displacement of the moveable mass is a function of a width of the slot.

13. The apparatus of claim 12, wherein a change in width of the slot is indicative of a shift in resonance of the optomechanical cavity.

14. The apparatus of claim 8, wherein the optomechanical oscillator comprises a chip-scale optical oscillator, wherein the photonic crystal includes holes formed therein on opposite sides of the slot to form a waveguide for an optical signal to travel through the slot.

15. The apparatus of claim 13, wherein a width of the slot is changeable based on the magnetic field such that a change in the width of the slot causes the shift in resonance of the optomechanical cavity, and wherein the shift in resonance is measured to provide an indication of the magnetic field.

16. A method of measuring a magnetic field, the method comprising:
   providing a current to an optomechanical oscillator structured to deform under a magnetic force to cause a shift in resonance associated with an optomechanical cavity formed in the optomechanical oscillator;
   placing the optomechanical oscillator in a magnetic field capable of providing the magnetic force;
   measuring light passed through the optomechanical oscillator to determine a change in resonance of the optomechanical cavity; and
   determining a measurement of the magnetic field based on the change in resonance.

17. The method of claim 16, wherein providing the current to the optomechanical oscillator comprises providing the current to a photonic crystal disposed at a slot defined between a fixed substrate and a moveable mass.

18. The method of claim 17, wherein the optomechanical oscillator comprises a chip-scale optical oscillator including the photonic crystal, the photonic crystal having holes formed therein on opposite sides of the slot to form a waveguide for an optical signal to travel through the slot.

* * * * *